United States Patent [19]
Al-Shareef et al.

[11] Patent Number: 6,111,285
[45] Date of Patent: Aug. 29, 2000

[54] BORIDE ELECTRODES AND BARRIERS FOR CELL DIELECTRICS

[75] Inventors: Husam N. Al-Shareef; Scott J. DeBoer, both of Boise; Dan Gealy, Kuna; Randhir P. S. Thakur, Boise, all of Id.

[73] Assignee: Micron Technology, Inc., Boise, Id.

[21] Appl. No.: 09/042,791

[22] Filed: Mar. 17, 1998

[51] Int. Cl.[7] .............................. H01L 29/76; H01L 33/00
[52] U.S. Cl. .......................................... 257/315; 257/296
[58] Field of Search ..................................... 257/315, 296

[56] References Cited

U.S. PATENT DOCUMENTS

| | | |
|---|---|---|
| 3,634,736 | 1/1972 | Boos et al. . |
| 5,142,438 | 8/1992 | Reinberg et al. . |
| 5,172,307 | 12/1992 | Tabuchi et al. . |
| 5,362,632 | 11/1994 | Mathews . |
| 5,406,447 | 4/1995 | Miyazaki . |
| 5,504,041 | 4/1996 | Summerfelt . |
| 5,567,964 | 10/1996 | Kashihara et al. . |
| 5,568,352 | 10/1996 | Hwang . |
| 5,585,300 | 12/1996 | Summerfelt . |
| 5,663,088 | 9/1997 | Sandhu et al. . |
| 5,665,628 | 9/1997 | Summerfelt . |
| 5,679,980 | 10/1997 | Summerfelt . |
| 5,686,339 | 11/1997 | Lee et al. . |
| 5,688,724 | 11/1997 | Yoon et al. . |
| 5,690,727 | 11/1997 | Azuma et al. . |
| 5,696,018 | 12/1997 | Summerfelt et al. . |
| 5,696,040 | 12/1997 | Jarrold et al. . |

OTHER PUBLICATIONS

Shappirio et al., "Diboride Diffusion Barriers in Silicon and GaAs Technology", J. Vac. Sci. Technol. B, vol. 4, No. 6, Nov./Dec. 1986.

Hideaki Matsuhashi et al., "Optimum Electrode Materials for $Ta_2O_5$ Capacitors at High and Low Temperature Processes," Extended Abstracts of the 1993 International Conference on Solid State Devices and Materials, Makuhari, 1993, pp. 853–855.

K. W. Kwon et al., "Degradation–Free $Ta_2O_5$ Capacitor After BPSG Reflow at 850° C for High Density DRAMSs", Advanced Technology Center, Samsung Electronics Co. 1993, pp. 3.5.1 to 3.5.3.

*Primary Examiner*—Stephen D. Meier
*Attorney, Agent, or Firm*—Dickstein Shapiro Morin & Oshinsky LLP

[57] ABSTRACT

Titanium boride ($TiB_x$), zirconium boride ($ZrB_x$) and hafnium boride ($HfB_x$) barriers and electrodes for cell dielectrics for integrated circuits, particularly for DRAM cell capacitors. The barriers protect cell dielectrics from diffusion and other interaction with surrounding materials during subsequent thermal processing.

47 Claims, 11 Drawing Sheets

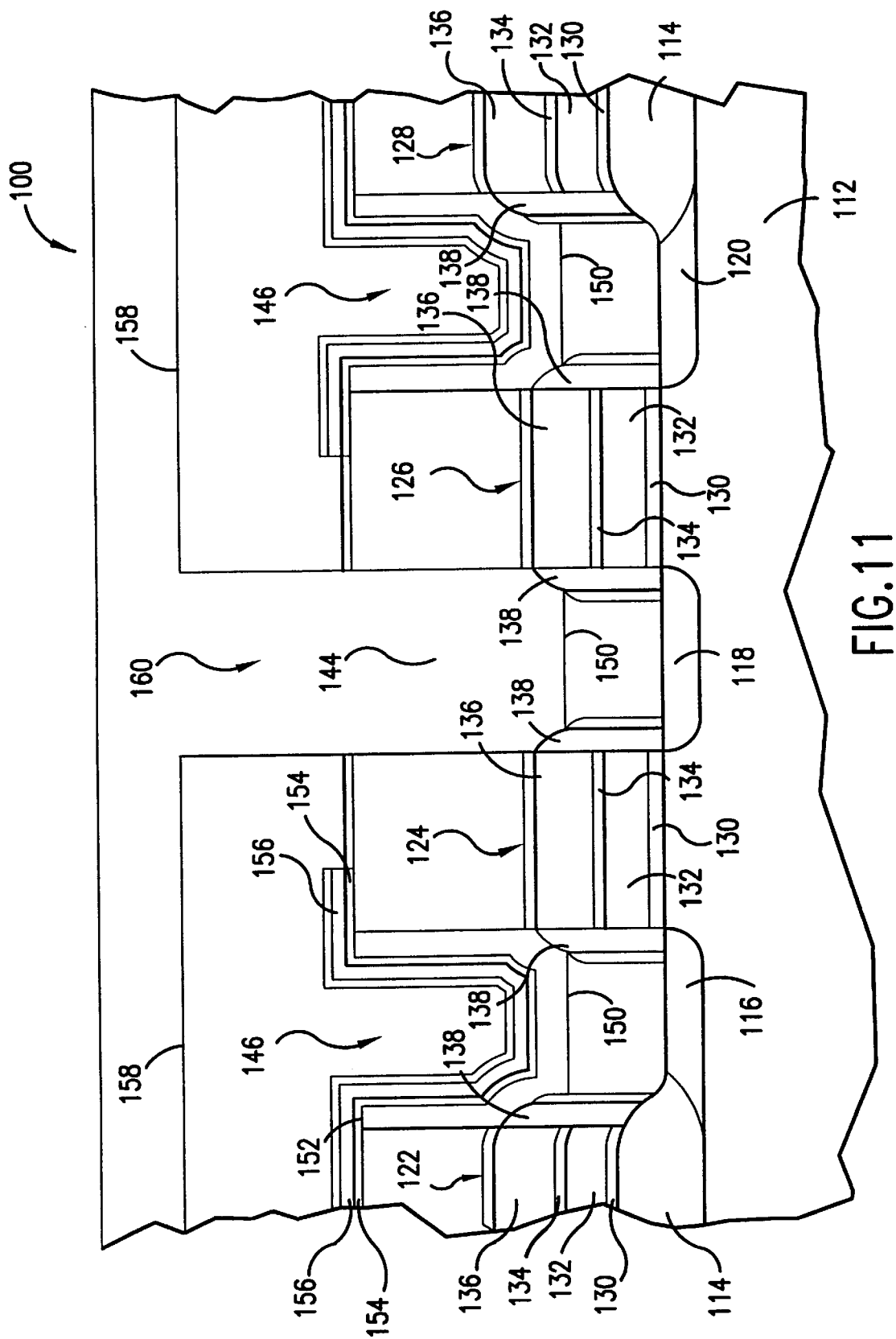

BORIDE ELECTRODES AND BARRIERS FOR CELL DIELECTRICS

FIELD OF THE INVENTION

The invention relates generally to integrated circuits and more particularly to the use of transition metal boride materials for electrodes and barrier layers to protect cell dielectrics in capacitors for such circuits.

BACKGROUND OF THE INVENTION

Capacitors are used in a wide variety of integrated circuits. Capacitors are of special concern in DRAM (dynamic random access memory) circuits; therefore, the invention will be discussed in connection with DRAM memory circuits. However, the invention has broader applicability and is not limited to DRAM memory circuits. It may be used in other types of memory circuits, such as SRAMs, as well as any other circuit in which cell dielectrics are used.

DRAM memory circuits are manufactured by replicating millions of identical circuit elements, known as DRAM cells, on a single semiconductor wafer. A DRAM cell is an addressable location that can store one bit (binary digit) of data. In its most basic form, a DRAM cell consists of two circuit components: a storage capacitor and an access field effect transistor.

There is continuous pressure in the industry to decrease the size of individual cells and increase memory cell density to allow more memory to be squeezed onto a single memory chip. However, it is necessary to maintain a sufficiently high storage capacitance to maintain a charge at the refresh rates currently in use even as cell size continues to shrink. This requirement has led DRAM manufacturers to turn to three dimensional capacitor designs, including trench and stacked capacitors.

Stacked capacitors are capacitors which are stacked, or placed, over the access transistor in a semiconductor device. In contrast, trench capacitors are formed in the wafer substrate beneath the transistor. For reasons including ease of fabrication and increased capacitance, most manufacturers of DRAMs larger than 4 Megabits use stacked capacitors. Therefore, the present invention will be discussed in connection with stacked capacitors, but should not be understood to be limited thereto.

One widely used type of stacked capacitor is known as a container capacitor. Known container capacitors are in the shape of an upstanding tube (cylinder) with an oval or circular cross section. The wall of the tube consists of two electrodes, i.e., two plates of conductive material, such as doped polycrystalline silicon (referred to herein as polysilicon or poly), separated by a dielectric. A preferred dielectric is tantalum pentoxide ($Ta_2O_5$). The bottom end of the tube is closed, with the outer wall in contact with either the drain of the access transistor or a plug which itself is in contact with the drain. The other end of the tube is open. The sidewall and closed end of the tube form a container; hence the name "container capacitor." Although the invention will be further discussed in connection with stacked container capacitors, the invention should not be understood to be limited thereto.

The electrodes in a DRAM cell capacitor must be conductive, and must protect the dielectric film from interaction with interlayer dielectrics (e.g., BPSG) and from the harsh thermal processing encountered in subsequent steps of DRAM process flow. For example, $Ta_2O_5$ dielectrics may be used for high density DRAMs such as 64 Mbit and 256 Mbit DRAMs, because chemical vapor deposition (CVD) of $Ta_2O_5$ provides a high dielectric constant ($\approx 25$) and good step coverage. However, the ability of $Ta_2O_5$ and other high dielectrics to withstand high temperature processes, such as the BPSG reflow process after capacitor formation, is the most serious hurdle to overcome in the application of these dielectrics to the DRAM process.

Kwon, K. W. et al., "Degradation-Free $Ta_2O_5$ Capacitor After BPSG Reflow at 850° C. for High Density DRAMs," IEDM 93-53 (1993 IEEE), refers to a $Ta_2O_5$ capacitor having a TiN/poly-Si top electrode which exhibited low leakage current after BPSG reflow at 850° C. The TiN top electrode was coated with a barrier layer of poly-Si to protect the underlying $Ta_2O_5$ dielectric during the high temperature reflow. However, TiN from organic precursors, e.g., $((CH_3N)_4)_4Ti$, has a relatively high resistivity, and thus is not particularly well-suited for high performance devices.

What is needed is a thermally robust capacitor which maintains good electrode conductivity and frequency response. The capacitor electrodes must offer a combination of good barrier properties (to protect the dielectric film), and good conductivity to improve the frequency response of the capacitor and minimize depletion effects.

SUMMARY OF THE INVENTION

The present invention provides boride barrier layers to protect cell dielectrics such as $Ta_2O_5$, $SrTiO_3$ ("ST"), (Ba, Sr)$TiO_3$ ("BST"), Pb(Z,Ti)$O_3$ ("PZT"), $SrBi_2Ta_2O_9$ ("SBT") and Ba(Zr,Ti)$O_3$ ("BZT") against dielectric degradation through thermal effects and interaction with surrounding materials. $TiB_x$ (x=1 to 3), $ZrB_x$ (x=1 to 3) and $HfB_x$ (x=1 to 3) layers provide excellent barrier protection, and good conductivity as capacitor electrodes, and so may be employed either as capacitor electrodes, or as separate barrier layers formed adjacent to conventional capacitor electrodes, either atop these electrodes or interposed between the electrode and the capacitor dielectric.

BRIEF DESCRIPTION OF THE DRAWINGS

FIG. 11 is a diagrammatic cross-sectional view of an alternative embodiment of the semiconductor wafer fragment shown in FIG. 10.

DETAILED DESCRIPTION OF THE PREFERRED EMBODIMENTS

An exemplary construction of a fabrication process for a capacitor according to one embodiment of the present invention is described below. It is to be understood, however, that this process is only one example of many possible capacitor configurations and processes utilizing the transition metal boride barriers or electrodes of the invention. For example, in the process described below, $TiB_x$, $ZrB_x$ or $HfB_x$ materials are utilized for the top electrode of the capacitor, and the bottom electrode comprises a conventional doped poly. Alternatively, the bottom electrode may also be comprised of $TiB_x$, $ZrB_x$ or $HfB_x$. Furthermore, doped poly or other conventional electrode materials may be used and then provided with a transition metal boride barrier layer atop the electrode, or between the electrode and the dielectric, or in both locations. In addition, in the process described below the bit line is formed over the capacitor. A buried bit-line process could also be used. As another example, the plugs under the capacitors formed by the following process could be eliminated. Also, dry or wet etching could be used rather than chemical mechanical polishing. The invention is not intended to be limited by the particular process described below.

Figure 1:
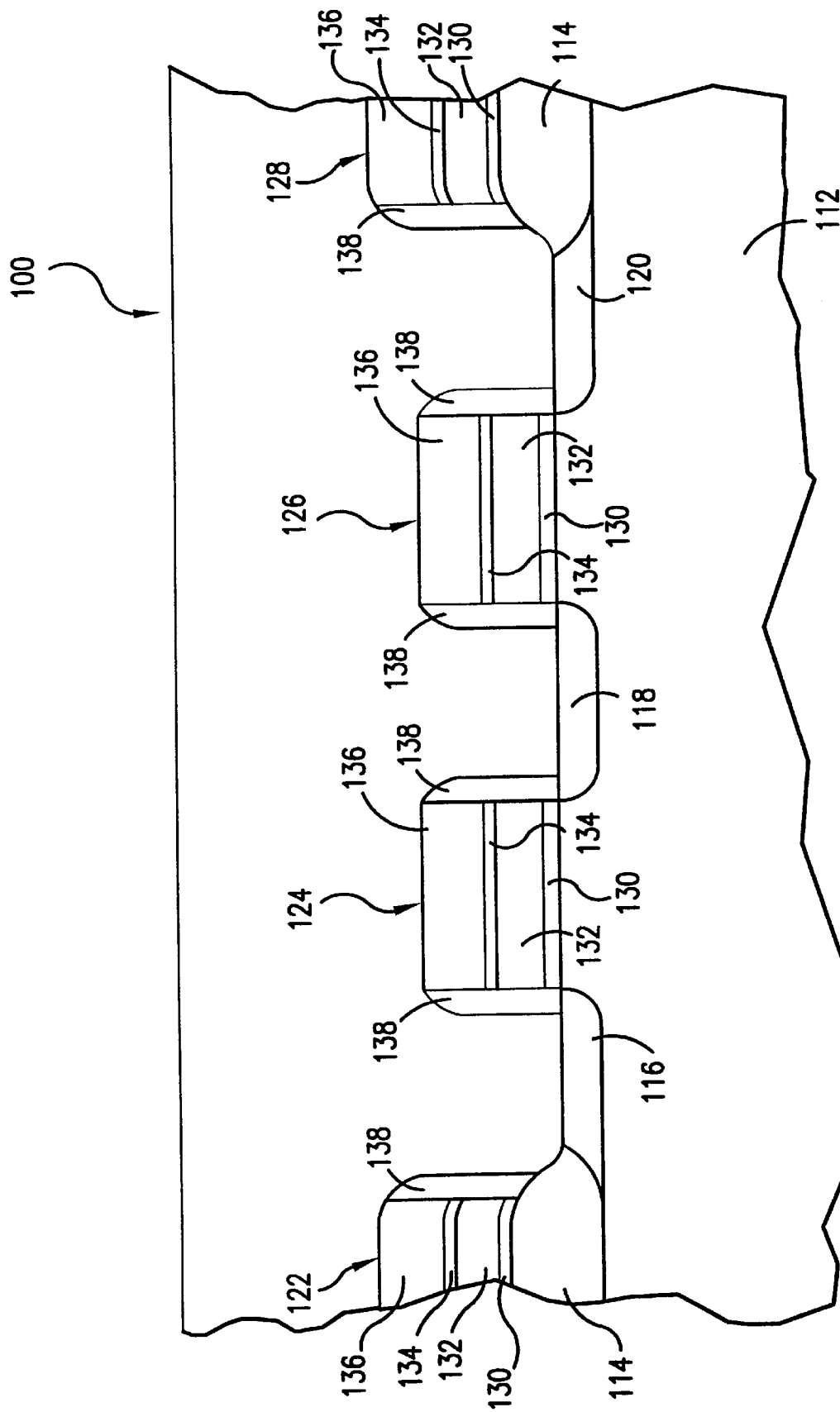
FIG. 1 is a diagrammatic cross-sectional view taken along a portion of a semiconductor wafer at an early processing step according to one embodiment of the present invention.

Referring to FIG. 1, a semiconductor wafer fragment at an early processing step is indicated generally by reference numeral 100. The semiconductor wafer 100 is comprised of a bulk silicon substrate 112 with field isolation oxide regions 114 and active areas 116, 118, 120. Word lines 122, 124, 126, 128 have been constructed on the wafer 100 in a conventional manner. Each word line consists of a lower gate oxide 130, a lower poly layer 132, a higher conductivity silicide layer 134 and an insulating silicon nitride cap 136. Each word line has also been provided with insulating spacers 138, also of silicon nitride.

Two FETs are depicted in FIG. 1. One FET is comprised of two active areas (source/drain) 116, 118 and one word line (gate) 124. The second FET is comprised of two active areas (source/drain) 118, 120 and a second word line (gate) 126. The active area 118 common to both FETs is the active area over which a bit line contact will be formed.

Figure 2:
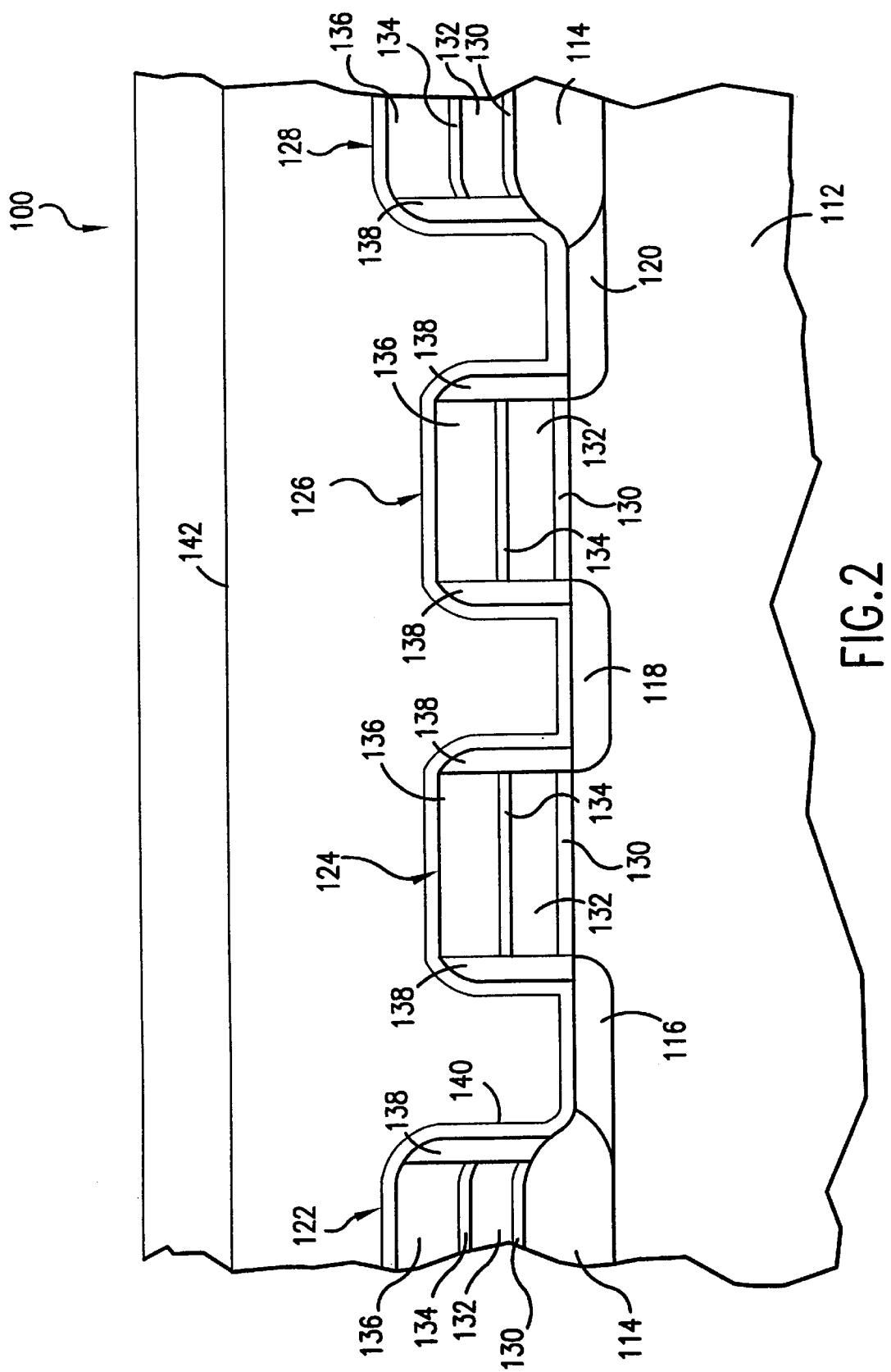
FIG. 2 is a diagrammatic cross-sectional view of a portion of a semiconductor wafer at a processing step subsequent to that shown in FIG. 1.

Referring to FIG. 2, a thin layer 140 of nitride or TEOS is provided atop the wafer 100. Next a layer of insulating material 142 is deposited. The insulating material preferably consists of borophosphosilicate glass (BPSG). The insulating layer 142 is subsequently planarized by chemical-mechanical polishing (CMP).

Figure 3:
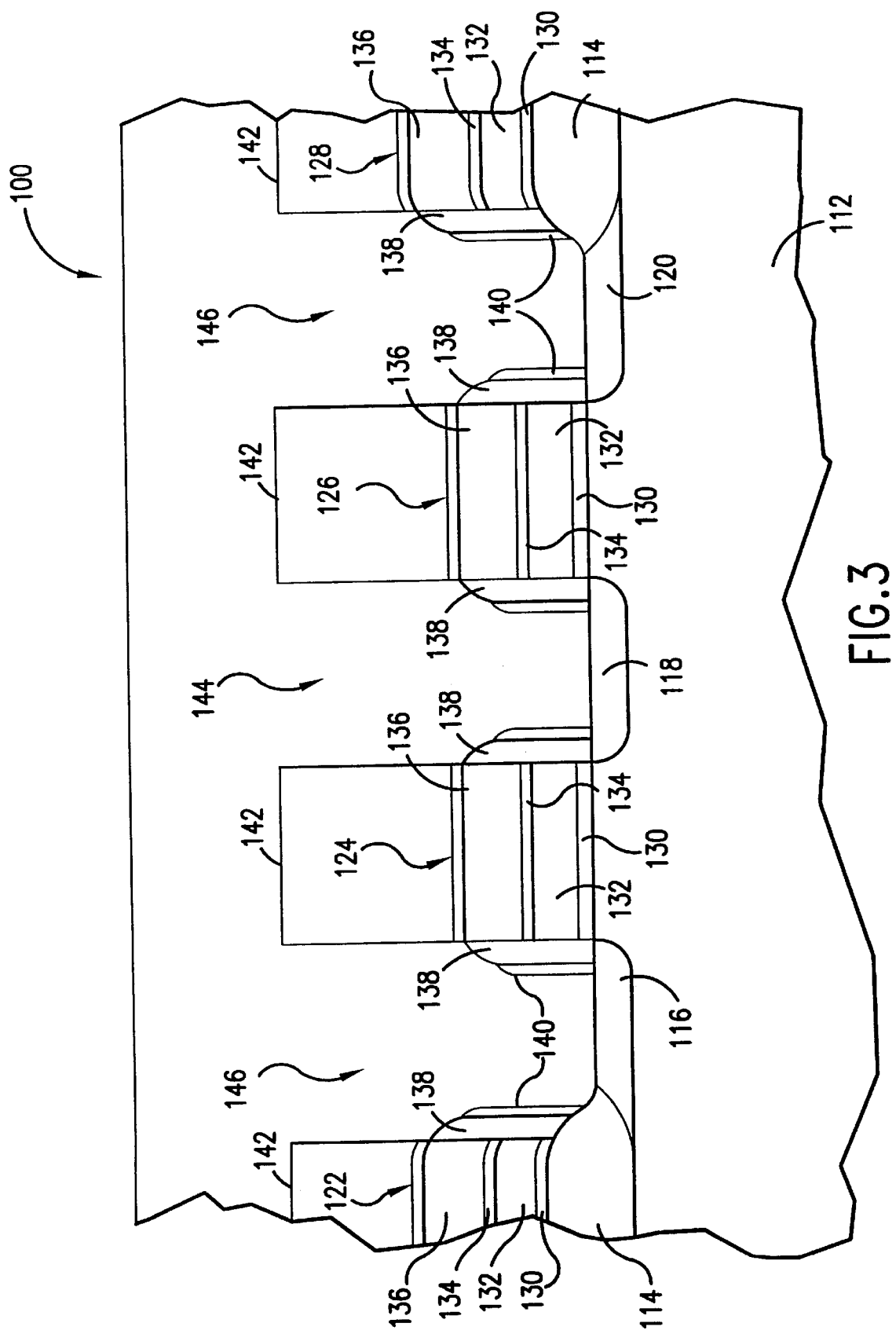
FIG. 3 is a diagrammatic cross-sectional view of a portion of a semiconductor wafer at a processing step subsequent to that shown in FIG. 2.
Figure 4:
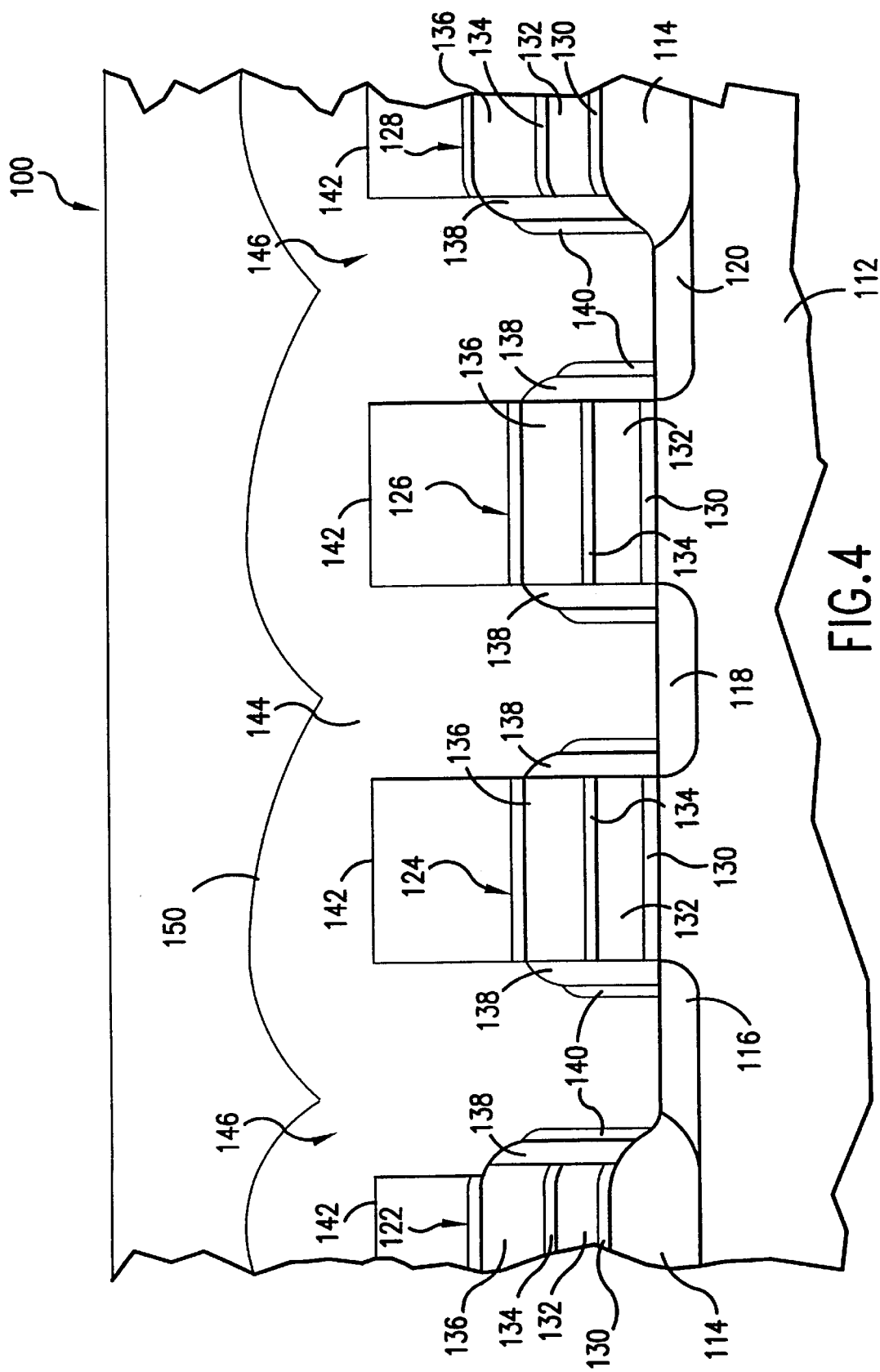
FIG. 4 is a diagrammatic cross-sectional view of a portion of a semiconductor wafer at a processing step subsequent to that shown in FIG. 3.
Figure 5:
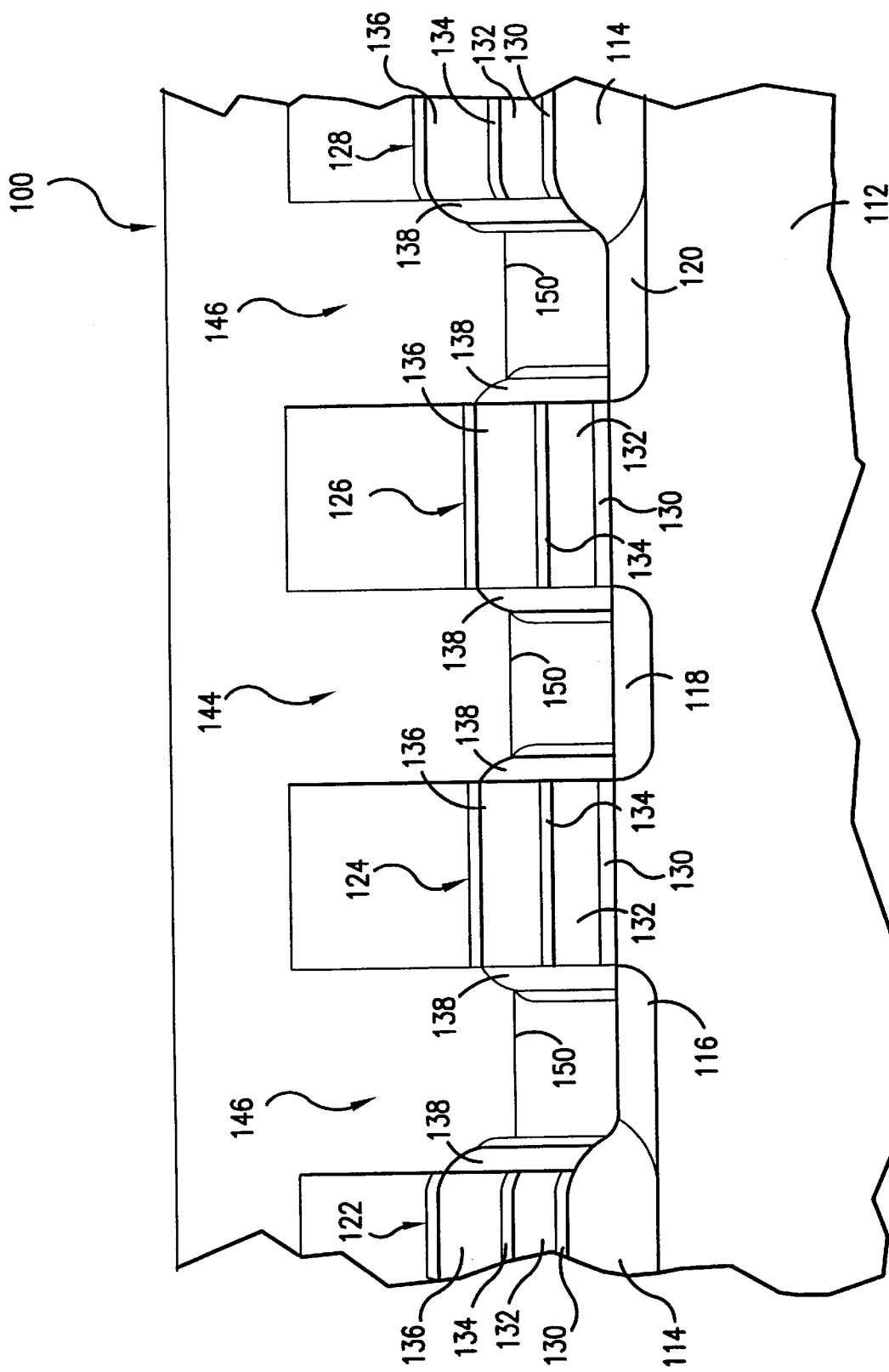
FIG. 5 is a diagrammatic cross-sectional view of a portion of a semiconductor wafer at a processing step subsequent to that shown in FIG. 4.

Referring to FIG. 3, a bit line contact opening 144 and capacitor openings 146 have been formed through the insulating layer 142. The openings 144, 146 are formed through the insulating layer 142 by photomasking and dry chemical etching the BPSG relative to the thin nitride layer 140. Referring now to FIG. 4, a layer 150 of conductive material is deposited to provide conductive material within the bit line contact and capacitor openings 144, 146. The conductive layer 150 is in contact with the active areas 116, 118, 120. An example of the material used to form layer 150 is in situ arsenic or phosphorous doped poly. Referring now to FIG. 5, the conductive layer 150 is etched away to the point that the only remaining material forms plugs 150 over the active areas 116, 118, 120.

Figure 6:
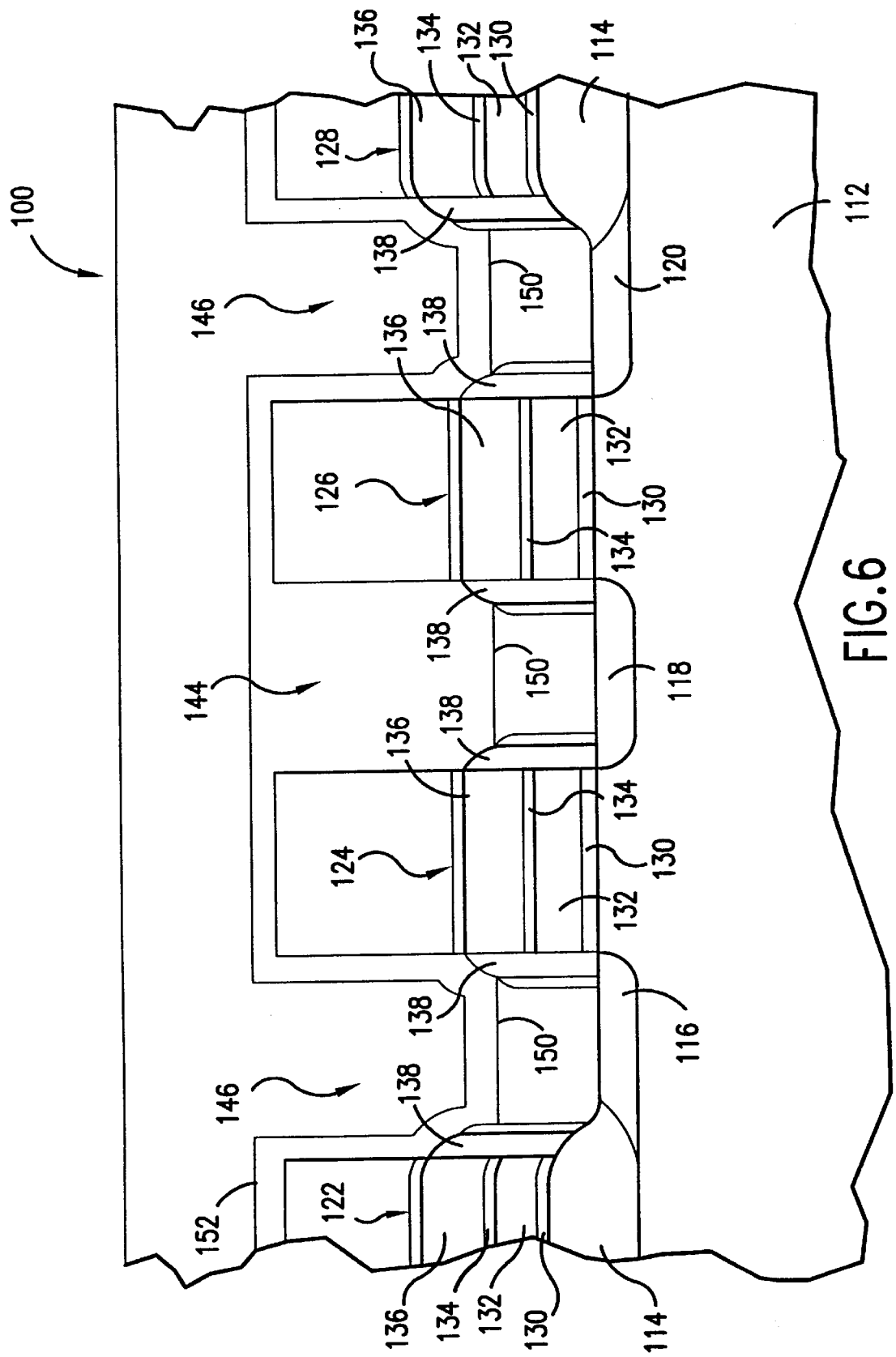
FIG. 6 is a diagrammatic cross-sectional view of a portion of a semiconductor wafer at a processing step subsequent to that shown in FIG. 5.

Referring to FIG. 6, a layer 152 of conductive material that will eventually form one of the electrodes of the capacitor is deposited at a thickness such that the bit line contact and capacitor openings 144, 146 are not closed off. The layer 152 may be formed of hemispherical grained poly (HSG) to increase capacitance. If HSG poly is to be used, the layer 152 may be formed by first depositing a layer of in situ doped polysilicon followed by a deposition of undoped HSG. Subsequent heating inherent in wafer processing will effectively conductively dope the overlying HSG layer. The conductive layer 152 may be provided by in situ arsenic doping of an entire HSG layer. The conductive layer 152 is in electrical contact with the previously formed plugs 150.

Figure 7:
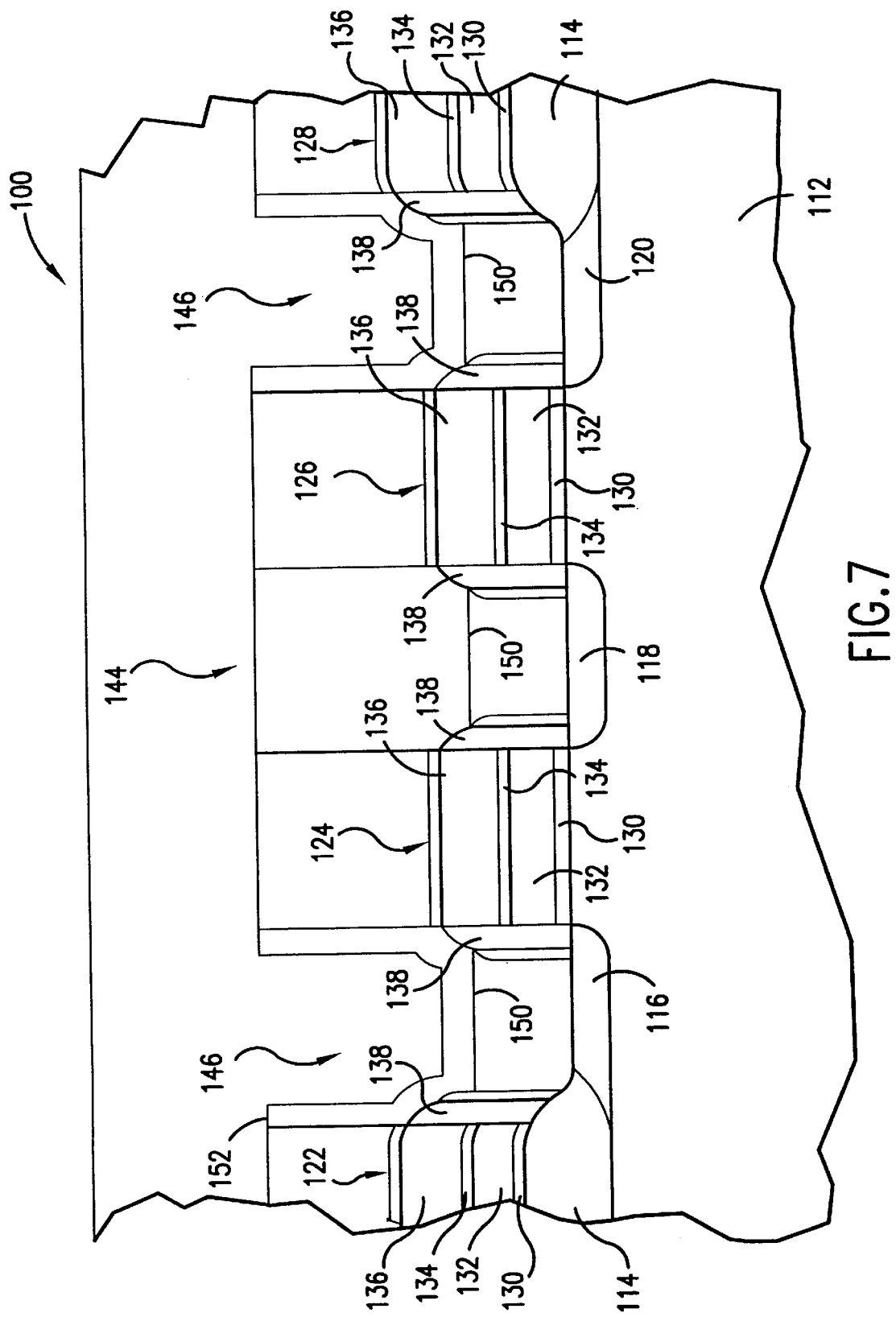
FIG. 7 is a diagrammatic cross-sectional view of a portion of a semiconductor wafer at a processing step subsequent to that shown in FIG. 6.
Figure 8:
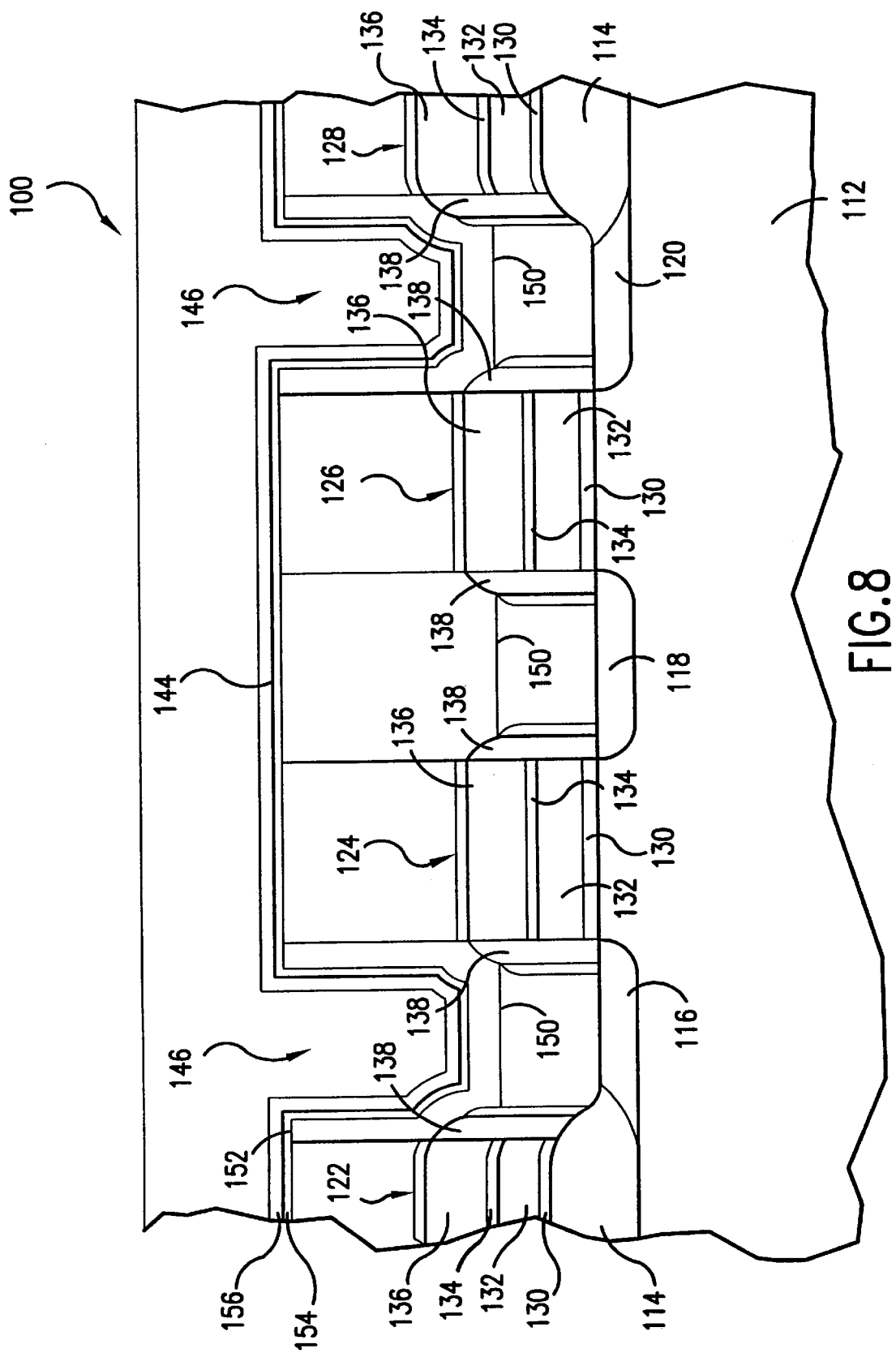
FIG. 8 is a diagrammatic cross-sectional view of a portion of a semiconductor wafer at a processing step subsequent to that shown in FIG. 7.

Referring to FIG. 7, the portion of the conductive layer 152 above the top of the BPSG layer 142 is removed through a planarized etching process, thereby electrically isolating the portions of layer 152 remaining in the bit line contact and capacitor openings 144, 146. Referring now to FIG. 8, a capacitor dielectric layer 154 is provided over conductive layer 152 and capacitor openings 144, 146.

Dielectric layer 154 is deposited with a thickness such that the openings 146 are again not completely filled. Dielectric layer 154 preferably comprises tantalum pentoxide ($Ta_2O_5$). However, other suitable dielectric materials such as Strontium Titanate (ST), Barium Strontium Titanate (BST), Lead Zirconium Titanate (PZT), Strontium Bismuth Tantalate (SBT) and Bismuth Zirconium Titanate (BZT) may also be used. Dielectric layer 154 may be deposited by a low-pressure CVD process using $Ta(OC_2H_5)_5$ and $O_2$ at about 430° C., and may be subsequently annealed in order to reduce leakage current characteristics.

A second conductive electrode layer 156 is then deposited by sputtering or CVD over the dielectric layer 154, again at a thickness which less than completely fills the capacitor openings 146. The second conductive layer 156 according to the present invention is comprised of $TiB_x$, $ZrB_x$, or $HfB_x$, where x is from 1 to 3 and, preferably, is 2. In addition to serving as the top electrode or second plate of the capacitor, the second conductive layer 156 also forms the interconnection lines between the second plates of all capacitors.

Figure 9:
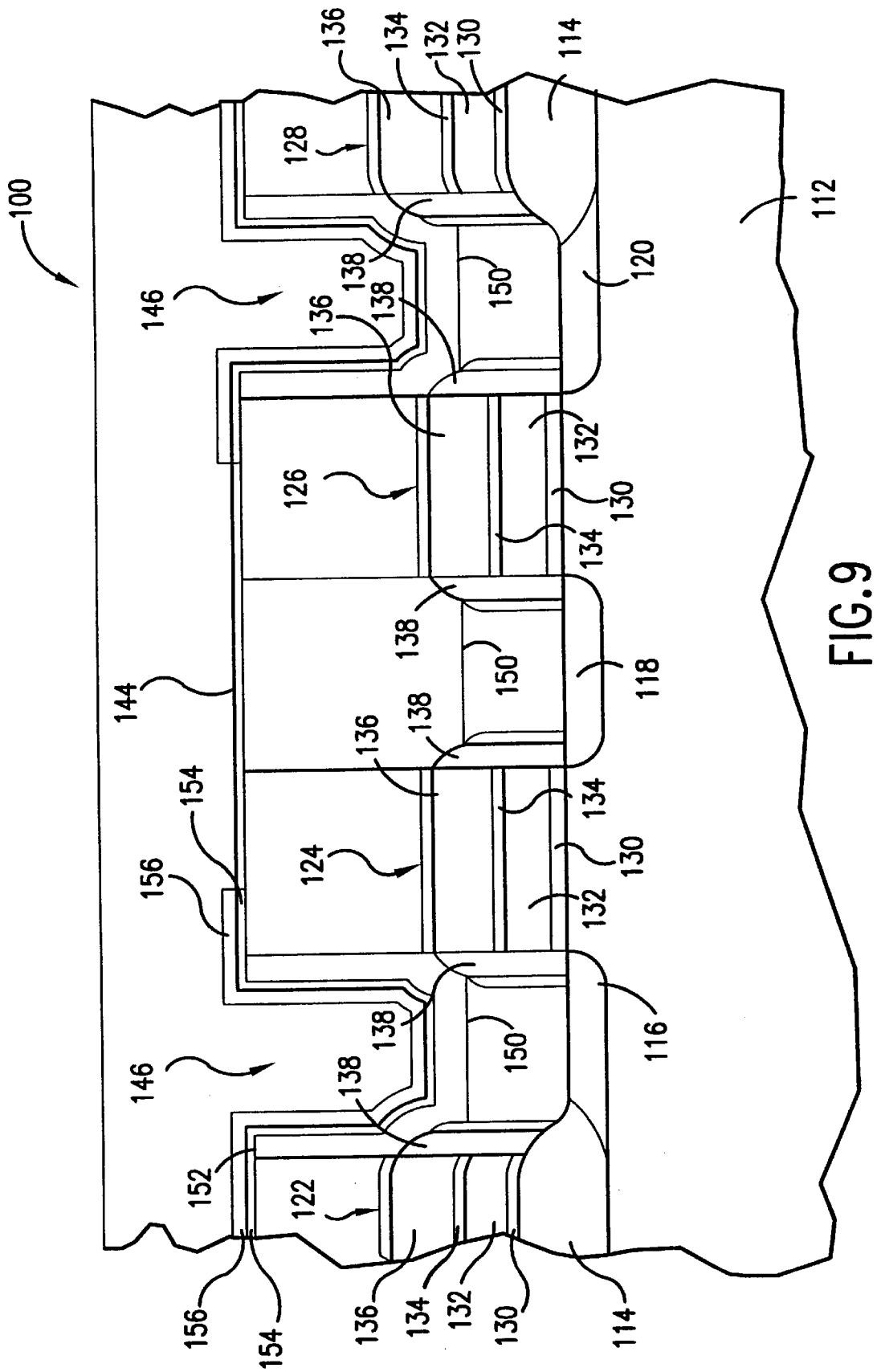
FIG. 9 is a diagrammatic cross-sectional view of a portion of a semiconductor wafer at a processing step subsequent to that shown in FIG. 8.

Referring to FIG. 9, the second conductive layer 156 and underlying capacitor dielectric layer 154 are patterned and etched such that the remaining portions of each group of the first conductive layer 152, capacitor dielectric layer 154, and second conductive layer 156 over the bit line contact and capacitor openings 144, 146 are electrically isolated from each other. In this manner, each of the active areas 116, 118, 120 are also electrically isolated (without the influence of the gate). Furthermore, a portion of the first conductive layer 152 in contact with the plug 150 over the bit line active area 118 is outwardly exposed.

Figure 10:
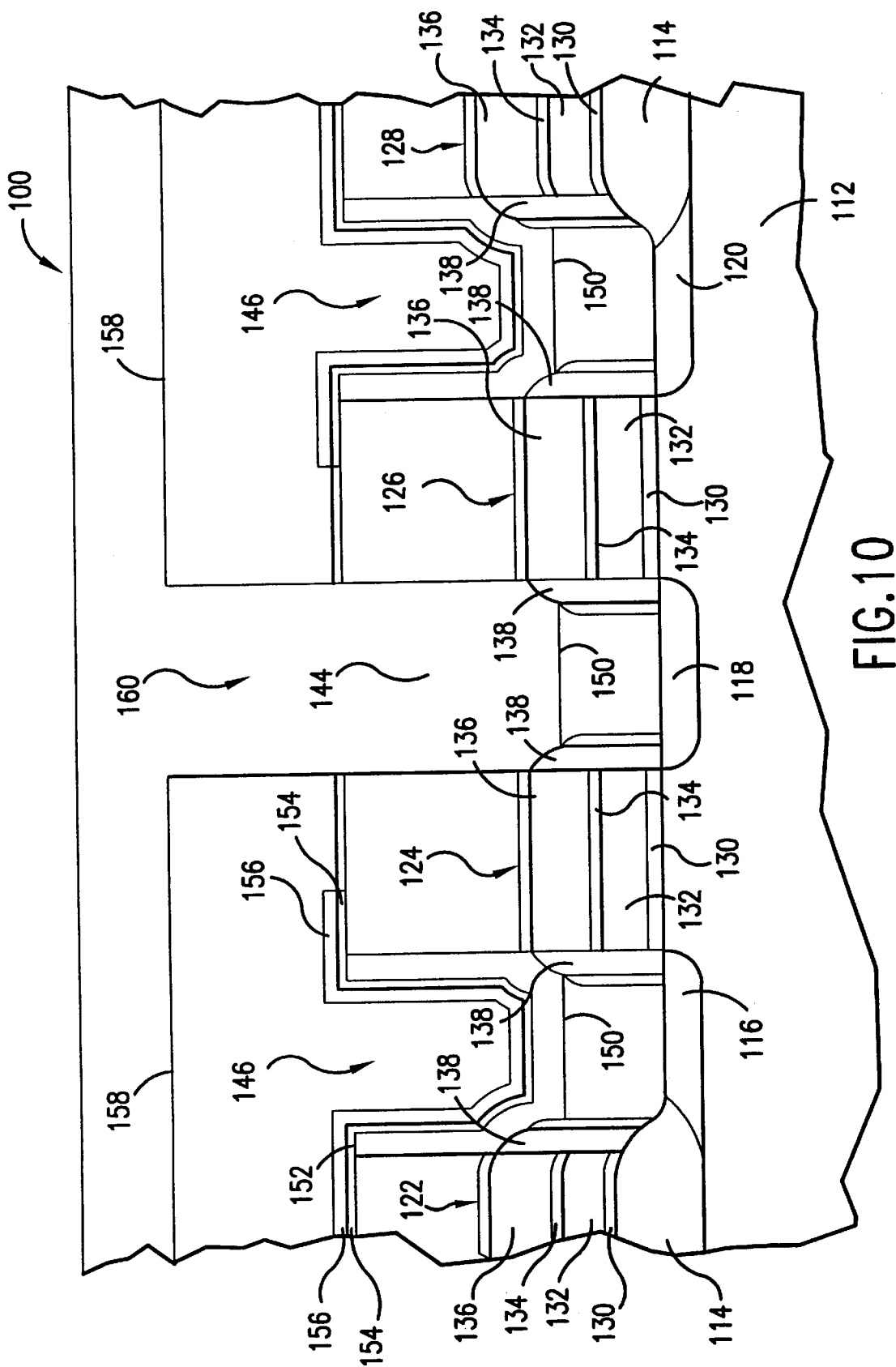
FIG. 10 is a diagrammatic cross-sectional view of a portion of a semiconductor wafer at a processing step subsequent to that shown in FIG. 9.

Referring now to FIG. 10, a bit line insulating layer 158 is provided over the second conductive layer 156 and into the bit line contact opening 144. The bit line insulating layer 158 is preferably comprised of BPSG. The BPSG is typically reflowed by conventional techniques, i.e., heating to about 800° C. The transition metal boride electrode 156 protects the capacitor dielectric layer 154 during the reflow process. Other insulating layers such as PSG, or other compositions of doped $SiO_2$ may similarly be employed as the insulating layer 158.

A bit line contact opening 160 is patterned through the bit line insulating layer 158 such that the plug conductive layer 150 is once again outwardly exposed. Then a bit line contact is provided in the bit line contact opening 160 such that the bit line contact is in electrical contact with the outwardly exposed portion of the conductive plug layer 150. Thus, the outwardly exposed portion of the plug 150 over the active area 118 common to both FETs acts as a bit line contact.

In an alternative embodiment shown in FIG. 11, second conductive layer 156 consists of conductively doped polysilicon or another conductive material suitable as a capacitor top electrode and a layer 161 of $TiB_x$, $ZrB_x$, or $HfB_x$ is applied via CVD atop second conductive layer 156 as a barrier to protect the underlying dielectric. This barrier layer may be as thin as 50 to 300 Angstroms and still provide protection for the dielectric during subsequent thermal processing.

The $TiB_x$, $ZrB_x$ and $HfB_x$ barrier layer and electrode materials according to the invention have excellent conductivity, higher than TiN and WNx, for example, and therefor reduce depletion effects and enhance frequency response. The materials also possess excellent barrier properties for protection of cell dielectrics during BPGS reflow and other high temperature steps after capacitor formation. In addition, the $TiB_x$, $ZrB_x$, or $HfB_x$ barriers according to the invention also substantially prevent diffusion to protect cell dielectrics from interaction with $SiO_2$ and other surrounding materials which may degrade the dielectric materials. Thus, the barriers/electrodes of the invention are not limited to use as top electrodes, but may also be employed both as top and bottom electrodes, and as additional barrier layers applied to any other top and/or bottom electrodes.

It should again be noted that although the invention has been described with specific reference to DRAM memory circuits and the top electrodes of container capacitors in such DRAM circuits, the invention has broader applicability and may be used in any integrated circuit requiring protective barriers or electrodes for cell dielectrics. Similarly, the process described above is but one method of many that could be used. Accordingly, the above description and accompanying drawings are only illustrative of preferred embodiments which can achieve and provide the objects, features and advantages of the present invention. It is not intended that the invention be limited to the embodiments shown and described in detail herein. The invention is only limited by the spirit and scope of the following claims.

What is claimed as new and desired to be protected by letters patent of the United States is:

1. A capacitor, comprising a first conductive layer, a dielectric layer, and a second conductive layer, at least one of said first and second conductive layers selected from the group consisting of $TiB_x$, $ZrB_x$ and $HfB_x$, where x is from 1 to 3.

2. The capacitor of claim 1 wherein said dielectric layer is selected from the group consisting of tantalum pentoxide ($Ta_2O_5$), Barium Strontium Titanate (BST), Strontium Titanate (ST),, Lead Zirconium Titanate (PZT), Strontium Bismuth Tantalate (SBT) and Bismuth Zirconium Titanate (BZT).

3. The capacitor of claim 1 wherein said at least one $TiB_x$, $ZrB_x$ and $HfB_x$ conductive layer comprises a top electrode for said capacitor.

4. The capacitor of claim 1 wherein said dielectric layer comprises $Ta_2O_5$.

5. The capacitor of claim 1 wherein said capacitor is selected from the group consisting of container capacitors, trench capacitors, crown capacitors, and stud capacitors.

6. A capacitor, comprising a dielectric layer, a first conductive layer, a second conductive layer, and a conductive barrier layer selected from the group consisting of $TiB_x$, $ZrB_x$ and $HfB_x$, where x is from 1 to 3.

7. The capacitor of claim 6, wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

8. The capacitor of claim 6 wherein said first conductive layer comprises an electrode for said capacitor and is interposed between said dielectric and said barrier layer.

9. The capacitor of claim 6 wherein said first conductive layer comprises an electrode for said capacitor and said barrier layer is interposed between said dielectric and said first conductive layer.

10. The capacitor of claim 6 wherein said dielectric layer comprises $Ta_2O_5$.

11. The capacitor of claim 6 wherein said capacitor comprises a container capacitor.

12. An integrated circuit comprising a capacitor, said capacitor comprising a first conductive layer, a dielectric layer, and a second conductive layer, at least one of said first and second conductive layers selected from the group consisting of $TiB_x$, $ZrB_x$ and $HfB_x$, where x is from 1 to 3.

13. The integrated circuit of claim 12 wherein said dielectric layer is selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT) and Bismuth Zirconium Titanate (BZT).

14. The integrated circuit of claim 12 wherein said at least one conductive layer is a top electrode for said capacitor.

15. The integrated circuit of claim 12 wherein said dielectric layer comprises $Ta_2O_5$.

16. The integrated circuit of claim 12 wherein said capacitor is a container capacitor.

17. An integrated circuit comprising a capacitor, said capacitor comprising a dielectric layer, a first conductive layer, a second conductive layer, and a conductive barrier layer, said barrier layer selected from the group consisting of $TiB_x$, $ZrB_x$ and $HfB_x$, where x is from 1 to 3.

18. The integrated circuit of claim 17, wherein the capacitor is a container capacitors, selected from the group consisting of trench capacitors, crown capacitors and stud capacitors.

19. The integrated circuit of claim 17, wherein the circuit is a memory circuit.

20. The integrated circuit of claim 19, wherein the circuit is a dynamic random access memory circuit.

21. A memory cell comprising:
    a transistor; and
    a capacitor having a dielectric diffusion barrier layer selected from the group consisting of $TiB_x$, $ZrB_x$ and $HfB_x$, where x is from 1 to 3.

22. The memory cell of claim 21, wherein said capacitor further comprises a dielectric layer selected from the group consisting of tantalum pentoxide ($Ta_2O_5$), Strontium Titanate (ST), Barium Strontium Titanate (BST), Lead Zirconium Titanate (PZT), Strontium Bismuth Titanate (SBT) and Bismuth Zirconium Titanate (BZT).

23. An integrated memory circuit comprising:
    a plurality of capacitors; and
    a plurality of bit lines;
    wherein said capacitors comprise a dielectric layer, and a dielectric diffusion barrier layer selected from the group consisting of $TiB_x$, $ZrB_x$ and $HfB_x$, where x is from 1 to 3.

24. The integrated memory circuit of claim 23, wherein said dielectric layer is selected from the group consisting of tantalum pentoxide ($Ta_2O_5$), Strontium Titanate (ST), Barium Strontium Titanate (BST), Lead Zirconium Titanate (PZT), Strontium Bismuth Tantalate (SBT) and Bismuth Zirconium Titanate (BZT).

25. The integrated circuit of claim 23, wherein said diffusion barrier is an electrode for said capacitor.

26. The integrated circuit of claim 23 wherein said capacitor is a container capacitor.

27. A capacitor, comprising a first conductive layer, a dielectric layer, and a second conductive layer, at least one of said first and second conductive layers comprising a material selected from the group consisting of $TiB_x$, $ZrB_x$ and $HfB_x$, where x is from 1 to 3, and said dielectric layer comprises a material selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT), and Bismuth Zirconium Titanate (BZT).

28. The capacitor of claim 27 wherein said at least one $TiB_x$, $ZrB_x$ and $HfB_x$ conductive layer comprises a top electrode for said capacitor.

29. The capacitor of claim 27 wherein said dielectric layer comprises $Ta_2O_5$.

30. The capacitor of claim 27 wherein said capacitor is selected from the group consisting of container capacitors, trench capacitors, crown capacitors, and stud capacitors.

31. A capacitor, comprising a dielectric layer, a first conductive layer, a second conductive layer, and a conductive barrier layer comprising a material selected from the group consisting of $TiB_x$, $ZrB_x$ and $HfB_x$, where x is from 1 to 3, and said dielectric layer comprises a material selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT), and Bismuth Zirconium Titanate (BZT).

32. The capacitor of claim 31 wherein said first conductive layer comprises an electrode for said capacitor and is interposed between said dielectric and said barrier layer.

33. The capacitor of claim 31 wherein said first conductive layer comprises an electrode for said capacitor and said barrier layer is interposed between said dielectric and said first conductive layer.

34. The capacitor of claim 31 wherein said dielectric layer comprises $Ta_2O_5$.

35. The capacitor of claim 31 wherein said capacitor comprises a container capacitor.

36. An integrated circuit comprising a capacitor, said capacitor comprising a first conductive layer, a dielectric layer, and a second conductive layer, at least one of said first and second conductive layers comprising a material selected from the group consisting of $TiB_x$, $ZrB_x$ and $HfB_x$, where x is from 1 to 3, and said dielectric layer comprises a material selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT), and Bismuth Zirconium Titanate (BZT).

37. The integrated circuit of claim 36 wherein said at least one conductive layer is a top electrode for said capacitor.

38. The integrated circuit of claim 36 wherein said dielectric layer comprises $Ta_2O_5$.

39. The integrated circuit of claim 36 wherein said capacitor is a container capacitor.

40. An integrated circuit comprising a capacitor, said capacitor comprising a dielectric layer, a first conductive layer, a second conductive layer, and a conductive barrier layer, said barrier layer comprising a material selected from the group consisting of $TiB_x$, $ZrB_x$ and $HfB_x$, where x is from 1 to 3, and said dielectric layer comprises a material selected from the group consisting of tantalum pentoxide ($Ta_2O_5$), Barium Strontium Titanate (BST), Strontium Titanate (ST), Lead Zirconium Titanate (PZT), Strontium Bismuth Tantalate (SBT), and Bismuth Zirconium Titanate (BZT).

41. The integrated circuit of claim 40, wherein the capacitor is a container capacitors, selected from the group consisting of trench capacitors, crown capacitors and stud capacitors.

42. The integrated circuit of claim 40, wherein the circuit is a memory circuit.

43. The integrated circuit of claim 40 wherein the circuit is a dynamic random access memory circuit.

44. A memory cell comprising:

a transistor;

a capacitor having a dielectric diffusion barrier layer comprising a material selected from the group consisting of $TiB_x$, $ZrB_x$ and $HfB_x$, where x is from 1 to 3; and wherein said capacitor further comprises a dielectric layer comprising a material selected from the group consisting of tantalum pentoxide ($Ta_2O_5$), Strontium Titanate (ST), Barium Strontium Titanate (BST), Lead Zirconium Titanate (PZT), Strontium Bismuth Titanate (SBT), and Bismuth Zirconium Titanate (BZT).

45. An integrated memory circuit comprising:

a plurality of capacitors; and a plurality of bit lines;

wherein said capacitors comprise a dielectric layer, and a dielectric diffusion barrier layer comprising a material selected from the group consisting of $TiB_x$, $ZrB_x$ and $HfB_x$, where x is from 1 to 3; and wherein said dielectric layer comprises a material selected from the group consisting of tantalum pentoxide ($Ta_2O_5$), Strontium Titanate (ST), Barium Strontium Titanate (BST), Lead Zirconium Titanate (PZT), Strontium Bismuth Tantalate (SBT), and Bismuth Zirconium Titanate (BZT).

46. The integrated circuit of claim 45, wherein said diffusion barrier is an electrode for said capacitor.

47. The integrated circuit of claim 45 wherein said capacitor is a container capacitor.

* * * * *